US008835762B2

(12) United States Patent
Gard et al.

(10) Patent No.: US 8,835,762 B2

(45) Date of Patent: Sep. 16, 2014

(54) APPARATUS FOR ELECTRICAL ISOLATION OF METALLIC HARDWARE

(75) Inventors: Leo Gard, Sherman Oaks, CA (US); Karl Wefers, Simi Valley, CA (US)

(73) Assignee: Aerojet Rocketdyne of DE, Inc, Canoga Park, CA (US)

(*) Notice: Subject to any disclaimer, the term of this patent is extended or adjusted under 35 U.S.C. 154(b) by 157 days.

(21) Appl. No.: 13/157,970

(22) Filed: Jun. 10, 2011

(65) Prior Publication Data

US 2012/0314394 A1 Dec. 13, 2012

(51) Int. Cl.
*H05K 9/00* (2006.01)
*H01B 19/00* (2006.01)

(52) U.S. Cl.
USPC .......... 174/50.5; 361/816; 361/739; 361/740; 361/741; 361/746; 361/600; 361/747; 174/50.53; 174/50; 174/50.51; 174/50.52

(58) Field of Classification Search
None
See application file for complete search history.

(56) References Cited

U.S. PATENT DOCUMENTS 2,177,522 A * 10/1939 Fletcher .......................... 62/288
3,363,079 A 1/1968 Schroyer
4,390,586 A 6/1983 Lemelson
4,897,231 A 1/1990 Scheurer et al.
5,577,151 A * 11/1996 Hoffer .......................... 385/135
5,608,267 A 3/1997 Mahulikar et al.
6,278,051 B1 8/2001 Peabody
6,544,886 B2 4/2003 Lu et al.
7,053,294 B2 5/2006 Tuttle et al.
7,592,695 B2 9/2009 Reis et al.
7,765,687 B2 * 8/2010 Pitzele et al. .................. 29/841
2006/0143920 A1 7/2006 Morrison et al.
2008/0285229 A1 * 11/2008 Watanabe et al. ............. 361/687
2010/0071936 A1 3/2010 Tan

FOREIGN PATENT DOCUMENTS

WO 96/37736 A1 11/1996

* cited by examiner

*Primary Examiner* — Vera Katz
(74) *Attorney, Agent, or Firm* — Joel G. Landau

(57) ABSTRACT

An apparatus for electrical isolation of metallic hardware is provided and includes an item of hardware and an isolation sheet disposed in contact with the item of hardware. The isolation sheet includes first and second opposing sides at least one of which is anodized.

4 Claims, 3 Drawing Sheets

APPARATUS FOR ELECTRICAL ISOLATION OF METALLIC HARDWARE

The present invention was conceived pursuant to DOE contract number DE-AC07-03SF22307. The government has certain rights to this invention.

BACKGROUND OF THE INVENTION

The present invention is directed to electrical isolation of metallic hardware.

Metallic hardware that is not easily anodized can be difficult to electrically isolate from a system. Anodizing non-aluminum hardware for electrical isolation typically involves plating or plasma coating the non-aluminum hardware with a metal that is easily anodized. This is not a desirable process to perform, however, due to problems occurring during plating or plasma coating. Another manner of isolating the non-aluminum hardware involves adhesively coupling fiberglass or another insulating material to the non-aluminum hardware. This, however, is also not practical for some situations where the adhesive can not be used or the debris from the insulation could cause other issues with the non-aluminum hardware.

BRIEF DESCRIPTION OF THE INVENTION

An apparatus for electrical isolation of metallic hardware is provided and includes an item of hardware and an isolation sheet disposed in contact with the item of hardware. The isolation sheet includes first and second opposing sides at least one of which is anodized.

A method of electrically isolating metallic hardware is provided and includes providing an isolation sheet with first and second opposite sides, forming the isolation sheet into a modified sheet having a shape similar to one or more surfaces of an item of hardware, anodizing at least one of the first and second sides of the modified sheet to form an anodized modified sheet.

A method of electrically isolating metallic hardware is provided and includes providing an isolation sheet with first and second opposite sides, anodizing at least one of the first and second sides of the isolation sheet to form an anodized sheet, forming the anodized sheet into a modified anodized sheet having a shape similar to one or more surfaces of an item of hardware.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

In accordance with aspects of the present invention, a thin sheet of aluminum is utilized and formed to be closely fit with an item of hardware. The sheet may be trapped or otherwise constrained in position relative to the item of hardware or may have tabs or other similar features to connect to the hardware to lock it in place. In another aspect, a shrink fit approach where one side of the sheet is heated and the other side is cooled may be utilized. In either aspect, the sheet may be anodized on the all surfaces prior to installation such that, after installation, the sheet electrically isolates the hardware from the rest of a system.

Figure 1:
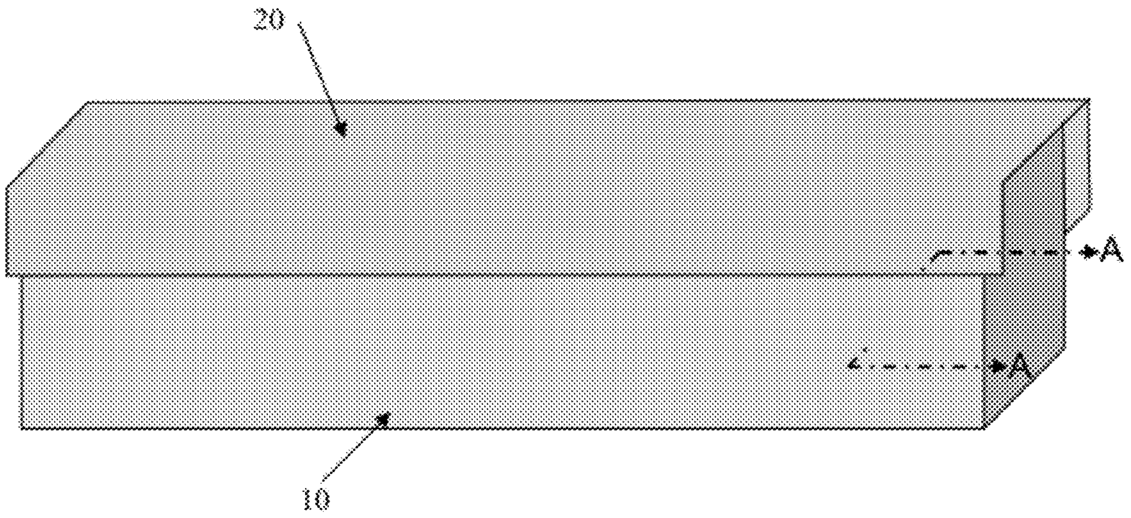
FIG. 1 is a perspective view of hardware with an anodized sheet connected thereto.
Figure 2:
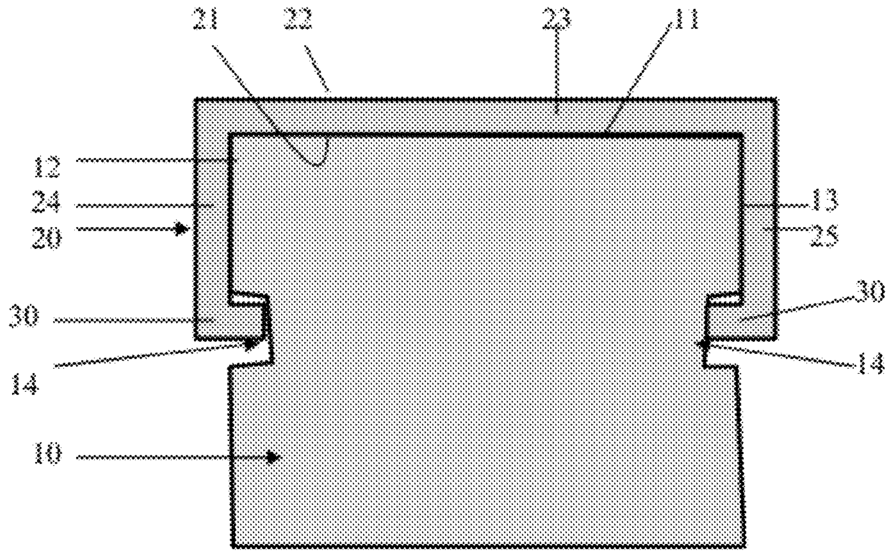
FIG. 2 is a cross-sectional view of the hardware and the anodized sheet of FIG. 1 taken along line A-A.

With reference to FIGS. 1 and 2, an item of hardware 10 that is formed of metallic materials that are not easily anodized or oxidized is provided. In accordance with embodiments, the hardware 10 may have a rectangular volumetric shape with an upper surface 11, a first lateral surface 12 and a second lateral surface 13. The hardware 10 may further include notches 14 running along the respective lengths of the first and second lateral surfaces 12 and 13. In accordance with further embodiments, it is to be understood that other shapes for the hardware 10 are possible.

An isolation sheet 20 is provided in connection with the hardware 10. The isolation sheet 20 has first and second opposite sides 21, 22, a central portion 23, a first lateral portion 24 and a second lateral portion 25. The isolation sheet 20 is disposed to contact with the hardware 10 such that a surface of the first side 21 at the central portion 23 contacts with the upper surface 11 of the hardware 10, a surface of the first side 21 at the first lateral portion 24 contacts with the first lateral surface 12 of the hardware 10 and a surface of the first side 21 at the second lateral portion 25 contacts with the second lateral surface 13 of the hardware 10.

In accordance with the embodiment of FIGS. 1 and 2, the isolation sheet 20 is further formed with tabs 30 at respective distal ends of the first lateral portion 24 and the second lateral portion 25. The tabs 30 register with the notches 14 in the hardware 10 to fasten and/or lock the isolation sheet 20 to the hardware 10. However, it is to be understood that the isolation sheet 20 can be coupled to, fastened to or otherwise connected to the hardware 10 in various manners. For example, the isolation sheet 20 may be fastened to the hardware 10 by way of a screw and nut combination. In any case, the isolation sheet 20 should contact the hardware 10 at one or more surfaces of the hardware (i.e., the three surfaces as shown in FIGS. 1 and 2).

Figure 3:
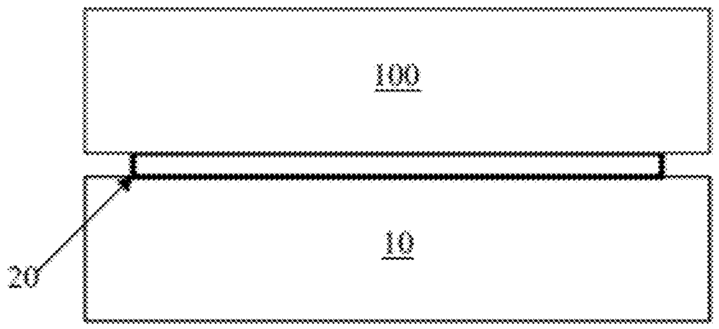
FIG. 3 is a cross-sectional view of hardware with an anodized sheet connected thereto in accordance with alternative embodiments.

With reference to FIG. 3 and, as mentioned above, the isolation sheet 20 may also be trapped for example between the hardware 10 and another feature 100 or otherwise constrained in a contact position. In this way, the isolation sheet 20 is maintained in contact with the hardware 10. In these cases, the tabs 30/notches 14 may or may not be necessary and correspondingly may or may not be present.

The isolation sheet 20 may be formed of aluminum, aluminum alloy or another material or materials that can be anodized or oxidized more easily than the material or materials of the hardware 10.

Figure 4:
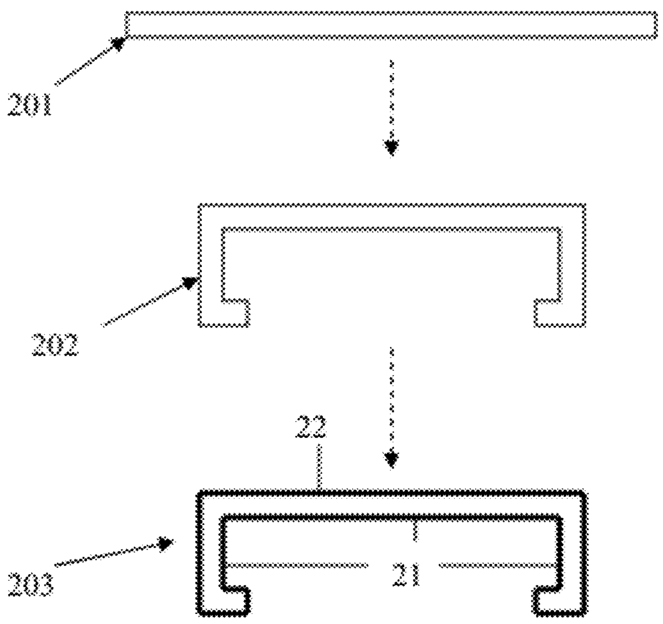
FIG. 4 is a flow diagram illustrating a process of forming an anodized sheet according to an embodiment.

The isolation sheet 20 is prepared in accordance with the following. Initially, the isolation sheet 20 is provided as a sheet 201 of, for example, aluminum or another similar material that can be anodized or oxidized. With reference to FIG. 4, the sheet 201 is formed into a modified sheet 202 with the shape described above. At that point, at least one or both of the first and second opposite sides 21, 22 of the modified sheet 202 are anodized (or oxidized) to form an anodized, modified sheet 203, which is connectable with the hardware 10 such that the at least one or both of the first and second opposite sides 21, 22 of the modified sheet 202 that is anodized contacts with a corresponding surface of the hardware 10.

Figure 5:
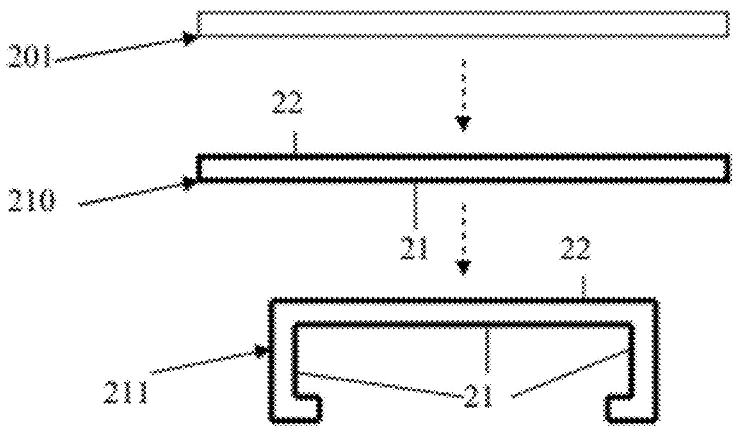
FIG. 5 is a flow diagram illustrating a process of forming an anodized sheet according to another embodiment.

In accordance with an alternative embodiment and with reference to FIG. 5, at least one or both of the first and second opposite sides 21, 22 of the isolation sheet 20 are anodized (or oxidized) to form an anodized sheet 210. The anodized sheet 210 is then formed into a modified, anodized sheet 211 with the shape described above. At that point, the modified, anodized sheet 211 is connected with the hardware 10 such that the at least one or both of the first and second opposite sides 21, 22 of the modified, anodized sheet 211 contacts with a corresponding surface of the hardware 10.

In either the embodiment of FIG. 4 or FIG. 5, the anodized sheet 203, 211 is disposed in contact with the hardware 10 such that at least one of the first and second sides 21, 22 contacts or mates with a corresponding surface of the hardware 10, as mentioned above. In this way, electrical isolation of the surface of the hardware 10 is achieved.

The present invention can be used with numerous types of hardware that need electrical isolation from other parts in a system, such as a multi-mission radioisotope thermoelectric generator (MMRTG) with, for example, a hardware substrate including Beryllium or other similar materials. More generally, the invention may be useful in electronic boxes, power generation systems and satellite components although it is to be understood that these cases are merely exemplary and that other uses are possible and within the scope of the invention.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. An apparatus for electrical isolation of metallic hardware, comprising:

an item of hardware having a volumetric shape including a longitudinal axis and exterior facing elongate faces, the exterior facing elongate faces comprising:

a first elongate face; and second elongate faces adjacent to opposite sides of the first elongate face and having slots defined therein to extend along respective thickness-wise central portions of the elongate faces in parallel with the longitudinal axis, wherein the slots are extended along a full length of the item of hardware; and an isolation sheet disposed in contact with the item of hardware, the isolation sheet including a first portion disposed in contact with the first elongate face and second portions respectively disposed in contact with respective portions of the second elongate faces;

wherein the isolation sheet includes first and second opposing sides at least one of which is anodized and each of the second portions includes a tab at respective distal ends thereof, which is disposed to register with a corresponding one of the slots wherein each of the tabs is extended along a full length of the isolation sheet.

2. The apparatus according to claim 1, wherein the isolation sheet is fastened to the item of hardware.

3. The apparatus according to claim 1, wherein the isolation sheet comprises aluminum.

4. The apparatus according to claim 1, wherein the item of hardware is a component of one or more of an electronic box, a power generation system and a satellite.

* * * * *